United States Patent
Shang

(10) Patent No.: US 8,008,912 B1
(45) Date of Patent: Aug. 30, 2011

(54) METHOD AND SYSTEM FOR TESTING P2 STIFFNESS OF A MAGNETORESISTANCE TRANSDUCER AT THE WAFER LEVEL

(75) Inventor: Changhe Shang, Fremont, CA (US)

(73) Assignee: Western Digital (Fremont), LLC, Fremont, CA (US)

( * ) Notice: Subject to any disclaimer, the term of this patent is extended or adjusted under 35 U.S.C. 154(b) by 360 days.

(21) Appl. No.: 12/336,218

(22) Filed: Dec. 16, 2008

(51) Int. Cl.
*G01R 33/12* (2006.01)
(52) U.S. Cl. ............... 324/210; 324/207.21; 360/324.11
(58) Field of Classification Search .................. None
See application file for complete search history.

(56) References Cited

U.S. PATENT DOCUMENTS

| | | | |
|---|---|---|---|
| 5,514,953 A | 5/1996 | Schultz et al. | |
| 5,998,993 A | 12/1999 | Inage et al. | |
| 6,239,603 B1 | 5/2001 | Ukei et al. | |
| 6,275,354 B1 | 8/2001 | Huai et al. | |
| 6,473,257 B1 | 10/2002 | Shimazawa et al. | |
| 6,479,988 B2 | 11/2002 | Hachisuka et al. | |
| 6,700,760 B1 * | 3/2004 | Mao | 360/324.2 |
| 6,707,064 B2 | 3/2004 | Jang et al. | |
| 6,788,502 B1 * | 9/2004 | Gill | 360/324.2 |
| 6,822,330 B2 | 11/2004 | Park et al. | |
| 6,844,751 B2 | 1/2005 | Marshall et al. | |
| 6,881,597 B2 | 4/2005 | Asayama et al. | |
| 6,887,724 B2 | 5/2005 | Nakamura et al. | |
| 7,068,058 B2 | 6/2006 | Park et al. | |
| 7,075,294 B2 | 7/2006 | Matsukuma et al. | |
| 7,123,456 B2 | 10/2006 | Kamata et al. | |
| 7,138,797 B2 | 11/2006 | Fox et al. | |
| 7,165,462 B2 | 1/2007 | Luo et al. | |
| 7,193,824 B2 | 3/2007 | Naka | |
| 7,270,896 B2 | 9/2007 | Parkin | |
| 7,317,597 B2 | 1/2008 | Naka | |
| 7,323,870 B2 | 1/2008 | Tatschl et al. | |
| 7,365,531 B2 | 4/2008 | Che et al. | |
| 7,367,109 B2 | 5/2008 | Li et al. | |
| 7,370,404 B2 | 5/2008 | Gill et al. | |
| 7,468,870 B2 | 12/2008 | Arasawa et al. | |
| 2003/0038626 A1 | 2/2003 | Carrington et al. | |
| 2003/0179511 A1 * | 9/2003 | Xiao et al. | 360/324.2 |
| 2006/0003185 A1 | 1/2006 | Parkin | |
| 2006/0028770 A1 | 2/2006 | Etoh et al. | |
| 2006/0066299 A1 | 3/2006 | Fox et al. | |
| 2006/0092582 A1 * | 5/2006 | Gill et al. | 360/324.12 |
| 2006/0112770 A1 | 6/2006 | Luo et al. | |
| 2006/0139802 A1 | 6/2006 | Sasaki et al. | |

(Continued)

OTHER PUBLICATIONS

S. Malhotra, et al, "Effect of Exchange Coupling Strength on Magnetic and Recording Properties of SAF Media", IEEE Transactions on Magnetics, vol. 38, No. 5, Sep. 2002, pp. 1931-1933.

(Continued)

*Primary Examiner* — Minh N Tang

(57) ABSTRACT

A method of testing P2 stiffness of a magnetoresistance (MR) sensor stack including a P2 pinned layer is provided. The method comprises the step of applying an external magnetic field to the MR sensor stack. The external magnetic field is oriented substantially perpendicular to a magnetic field of the P2 pinned layer. The method further comprises varying an amplitude of the external magnetic field, measuring a change in a resistance of the MR sensor stack in response to the varying amplitude of the external magnetic field, and calculating the P2 stiffness based on the measured change in resistance.

15 Claims, 6 Drawing Sheets

U.S. PATENT DOCUMENTS

2006/0221508 A1    10/2006  Iwase
2008/0037183 A1*    2/2008  Freitag et al. ............ 360/324.11
2008/0106257 A1     5/2008  Suzuki
2008/0247079 A1    10/2008  Satoh et al.
2009/0091344 A1     4/2009  Ausserlechner

OTHER PUBLICATIONS

Ronald R. Gans, et al., "On-Wafer Production Monitoring of GMR Spin Value Pinned Layer and Free Layer Properties". This paper appears in: Digests of INTERMAG 99 1999 IEEE International Magnetics Conference. Publication Date: May 18-21, 1999 on pp. DB02-DB02. ISBN: 0-7803-5555-5.

Chang He Shang, et al., "Temperature dependence of magnetoresistance and surface magnetization in ferromagnetic tunnel junctions", Physical Review B, vol. 58, No. 6, Aug. 1, 1998-II, pp. R2917-R2920.

Sangmun Oh, et al., "The Behavior of Pinned Layers Using a High-Field Transfer Curve", IEEE Transactions on Magnetics, vol. 41, No. 10, Oct. 2005, pp. 2950-2952.

* cited by examiner

Prior Art

METHOD AND SYSTEM FOR TESTING P2 STIFFNESS OF A MAGNETORESISTANCE TRANSDUCER AT THE WAFER LEVEL

FIELD OF THE INVENTION

The present invention generally relates to hard disk drives and, in particular, to a method and system for testing P2 stiffness of a magnetoresistance transducer at the wafer level.

BACKGROUND OF THE INVENTION

As the areal density of hard disk drives continues to increase, the design challenges relating to the tunneling magneto-resistive (TMR) film stacks used to manufacture read heads become more acute. One such challenge relates to the stability of the pinned layer (P2) in a TMR transducer.

FIG. 1 illustrates a TMR head film stack 100. The TMR head film stack 100 includes two NiFe outer shield layers S1 and S2. Over a seed layer (SL) of Ta or the like is disposed an antiferromagnetic material (AFM), such as IrMn or PtMn. Over antiferromagnetic material AFM is disposed a synthetic antiferromagnet made up of a ferromagnetic material (e.g., CoFeB) pinning layer P1, a spacer layer of Ru, and a ferromagnetic material (e.g., CoFeB) pinned layer P2. As can be seen with reference to FIG. 1, the magnetic field of the pinning layer P1 is oriented out of the page, and the magnetic field of the pinned layer P2 is oriented into the page. Over the synthetic antiferromagnet SAF is disposed an insulating tunnel barrier of AlO or MgO, over which is disposed a free layer (FL). A magnetic field of the free layer is oriented from right to left. Surrounding the foregoing layers is an insulator such as $Al_2O_3$, which serves to separate the foregoing layers from a CoPt hard bias layer (HB), which has a magnetic field oriented from right to left. Disposed over the free layer FL and the hard bias HB is a metal spacer, such as Ru or Ta.

In TMR heads, the pinned layer P2 plays an important role with respect to reliability and performance. The robustness of the head is directly related to both the magnetic coupling strength within the synthetic antiferromagnet (SAF), and the SAF/antiferromagnetic (AFM) integrity. To ensure head robustness, strong couplings are desired between the P1 and P2 layers and for exchange coupling between P1 and AFM. In this regard, low pinning strength can lead to early drive reliability failure. Poor coupling can also deteriorate head performance through pinned layer reversal. Inferior SAF/AFM coupling can cause head baseline noise or baseline popping degradation. Therefore, characterizing the pinning properties in the TMR film is important not only for new product development, but also for a volume production environment.

According to one aspect of the subject disclosure, the coupling strength between the pinning layer P1 and the antiferromagnet AFM may be several thousand Oersted (e.g., 3000 Oe). The coupling and/or pinning properties can be characterized at the slider or Head Gimbal Assembly (HGA) level using a high field quasi-static tester (QST) with a field of around 1.5 T. Applying such a powerful magnetic field to a TMR head, however, can permanently degrade the performance thereof. Testing with a high field QST is therefore usually only used for failure analysis purposes, and not for volume production.

SUMMARY OF THE INVENTION

Various embodiments of the present invention solve the foregoing problem by providing methods and systems for non-destructively testing the stiffness of a P2 layer in a TMR head at the wafer level. By measuring a change in resistance through a TMR film stack as a magnetic field normal to the P2 field is varied in intensity, the perturbation of the P2 field, and thus, the P2 stiffness, can be determined. Because the magnetic field is oriented normal to the field of the P2 layer, the field strength necessary to measure the P2 stiffness is low enough to be non-destructive to the TMR film stack.

According to one aspect of the subject disclosure, a method of testing P2 stiffness of a magnetoresistance (MR) sensor stack including a P2 pinned layer is provided. The method comprises the step of applying an external magnetic field to the MR sensor stack. The external magnetic field is oriented substantially perpendicular to a magnetic field of the P2 pinned layer. The method further comprises varying an amplitude of the external magnetic field, measuring a change in a resistance of the MR sensor stack in response to the varying amplitude of the external magnetic field, and calculating the P2 stiffness based on the measured change in resistance.

According to another aspect of the subject disclosure, a test structure for determining the P2 stiffness of a magnetoresistance (MR) sensor stack including a P2 pinned layer comprises a seed layer, an antiferromagnetic layer disposed over the seed layer, and a synthetic antiferromagnetic layer disposed over the antiferromagnetic layer. The synthetic antiferromagnetic layer includes a P1 pinning layer, a P2 pinned layer and a spacer layer separating the P1 pinning layer and the P2 pinned layer. The test structure further comprises a barrier layer disposed over the synthetic antiferromagnetic layer, a free layer disposed over the barrier layer, and two or more contact pads for measuring a resistance of a circuit path through the seed layer, the antiferromagnetic layer, the synthetic antiferromagnetic layer, the barrier layer and the free layer.

It is to be understood that both the foregoing summary of the invention and the following detailed description are exemplary and explanatory and are intended to provide further explanation of the invention as claimed.

BRIEF DESCRIPTION OF THE DRAWINGS

The accompanying drawings, which are included to provide further understanding of the invention and are incorporated in and constitute a part of this specification, illustrate embodiments of the invention and together with the description serve to explain the principles of the invention. In the drawings.

DETAILED DESCRIPTION OF THE INVENTION

In the following detailed description, numerous specific details are set forth to provide a full understanding of the present invention. It will be apparent, however, to one ordinarily skilled in the art that the present invention may be practiced without some of these specific details. In other instances, well-known structures and techniques have not been shown in detail to avoid unnecessarily obscuring the present invention.

Figure 2:
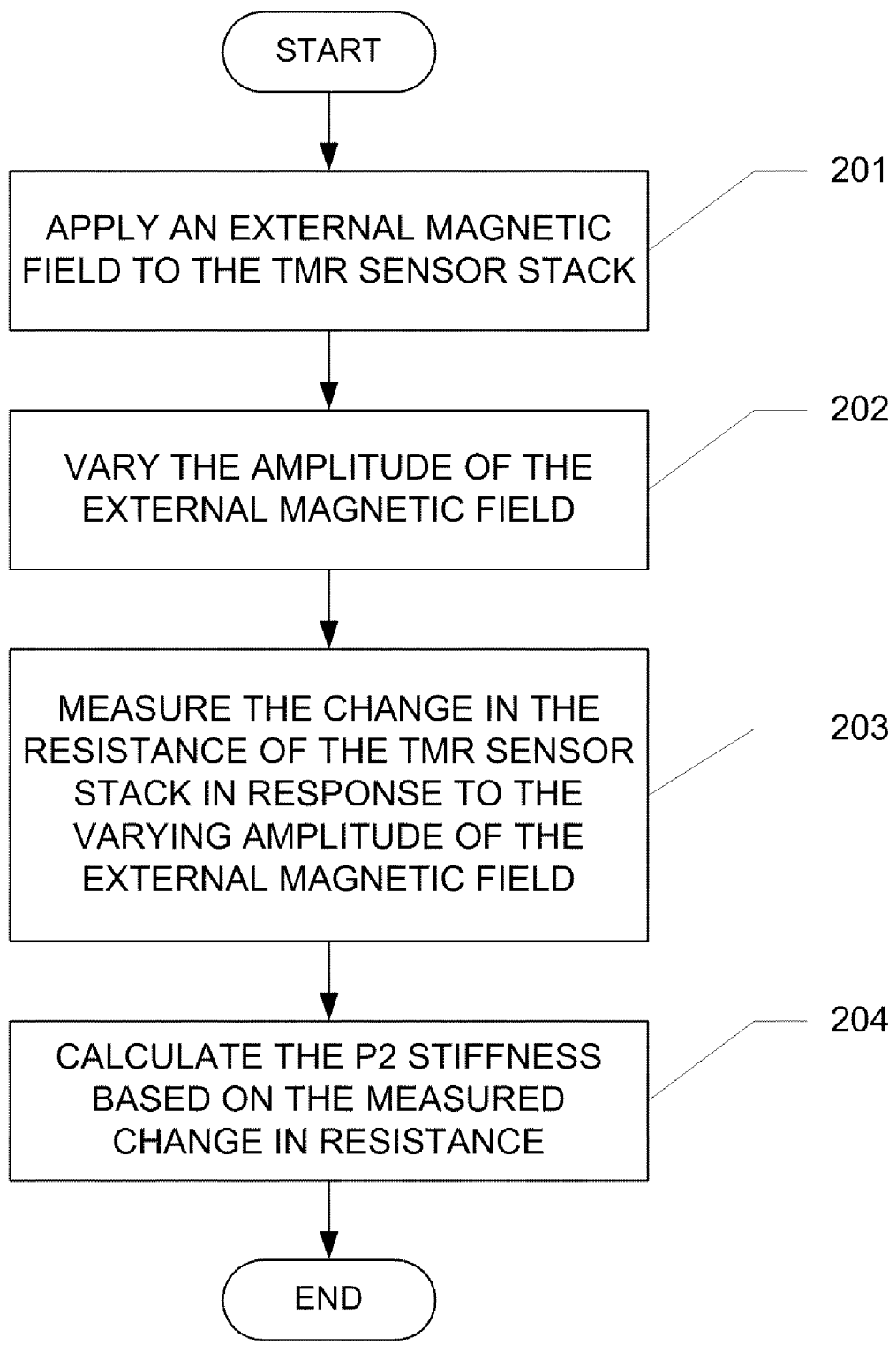
FIG. 2 is a flow chart illustrating a method of testing P2 stiffness of a TMR sensor stack including a P2 pinned layer, in accordance with one aspect of the subject disclosure.

FIG. 2 is a flow chart illustrating a method of testing the P2 stiffness of a tunneling magnetoresistance (TMR) sensor stack including a P2 pinned layer, in accordance with one aspect of the subject disclosure. The method begins with step 201, in which an external magnetic field is applied to the TMR sensor stack. The external magnetic field is oriented substantially perpendicular to the magnetic field of the P2 pinned layer. According to one aspect of the subject disclosure, the applied magnetic field may be in the same axis as the field of the hard bias layer HB.

When the magnetic field is substantially normal to the direction of the P2 field, the torque applied on the P2 field will be maximized, such that the P2 field can more easily be made to experience a slight perturbation rotation. Accordingly, the applied field can be more than an order of magnitude less than the P2 switching field (e.g., if the P2 and P1 antiferromagnetic coupling field is 7500 Oe, the applied magnetic field can be a few hundred Oersted), and still generate a detectable perturbation rotation in the P2 field. If the magnetic field were applied in the same direction as the P2 magnetization axis, by contrast, the torque on the P2 field would be essentially zero. Accordingly, the P2 field would not be perturbed (rotate) until the external field was strong enough to overcome the P2 switching field (e.g., ~7500 Oe). A magnetic field this strong would permanently alter the HB field, however (as this field would be substantially stronger than the HB coercivity of around 2500 Oe), and therefore negatively impact the head performance.

In step 202, the an amplitude of the external magnetic field is varied. According to one aspect of the subject disclosure, the amplitude of the sweeping magnetic field is kept lower than the coercivity of the HB layer (e.g., <2500 Oe), but higher than the interlayer coupling field (e.g., >50 Oe). For example, the amplitude of the applied magnetic field may be varied between about +50% of the HB coercivity and −50% of the HB coercivity (e.g., between −1000 Oe and +1000 Oe). Keeping the field strength between these values allows for non-destructive testing of the TMR film stack.

While in the foregoing exemplary embodiment, the P2 switching field, the applied magnetic field, and the hard bias coercivity have been described with reference to particular field strengths, the scope of the present invention is not limited to such an arrangement. Rather, as will be readily apparent to one of skill in the art, these values are merely exemplary, and are intended to provide further explanation of the invention as claimed.

Figure 3:
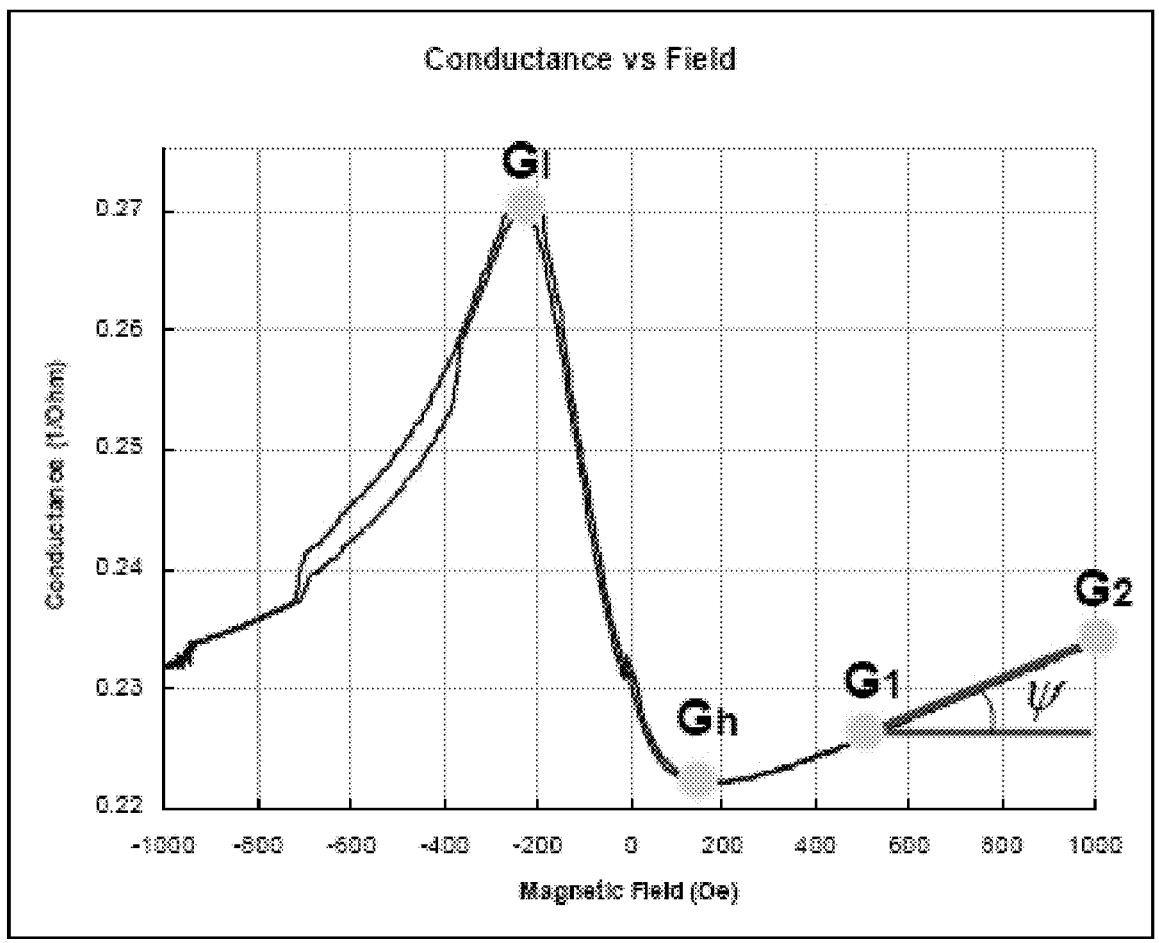
FIG. 3 is a graph illustrating a longitudinal transfer curve of the conductance of a TMR sensor stack vs. an applied magnetic field strength in accordance with one aspect of the subject disclosure.

In step 203, a change in the resistance of the TMR sensor stack in response to the varying amplitude of the external magnetic field is measured. The resistance is measured along a circuit path passing through the free layer, the barrier layer, the synthetic antiferromagnetic layer, the antiferromagnetic layer and the seed layer. During the perturbation rotation of the P2 field, the free layer can be treated as stationary along the applied field. Because the rotation angle is relatively small (e.g., <10 degrees), the conductance will vary almost linearly with the applied field. This can be seen with reference to the graph in FIG. 3, which illustrates a longitudinal transfer curve of the conductance of a TMR sensor stack vs. an applied magnetic field strength in accordance with one aspect of the subject disclosure.

In step 204, the P2 stiffness is calculated based on the measured change in resistance. The linear range between $G_1$ and $G_2$, illustrated in FIG. 3, can be used to calculate the P2 stiffness $H_{P2S}$ according to the equation:

$$H_{P2S} = \frac{G_l - G_h}{G_2 - G_1} \Delta H \tag{1}$$

where $G_l$ is a maximum measured conductance, $G_h$ is a minimum measured conductance, $G_1$ and $G_2$ are two conductance values in a substantially linear region of the transfer curve, and $\Delta H$ is a change in the applied magnetic field between $G_1$ and $G_2$.

Figure 4:
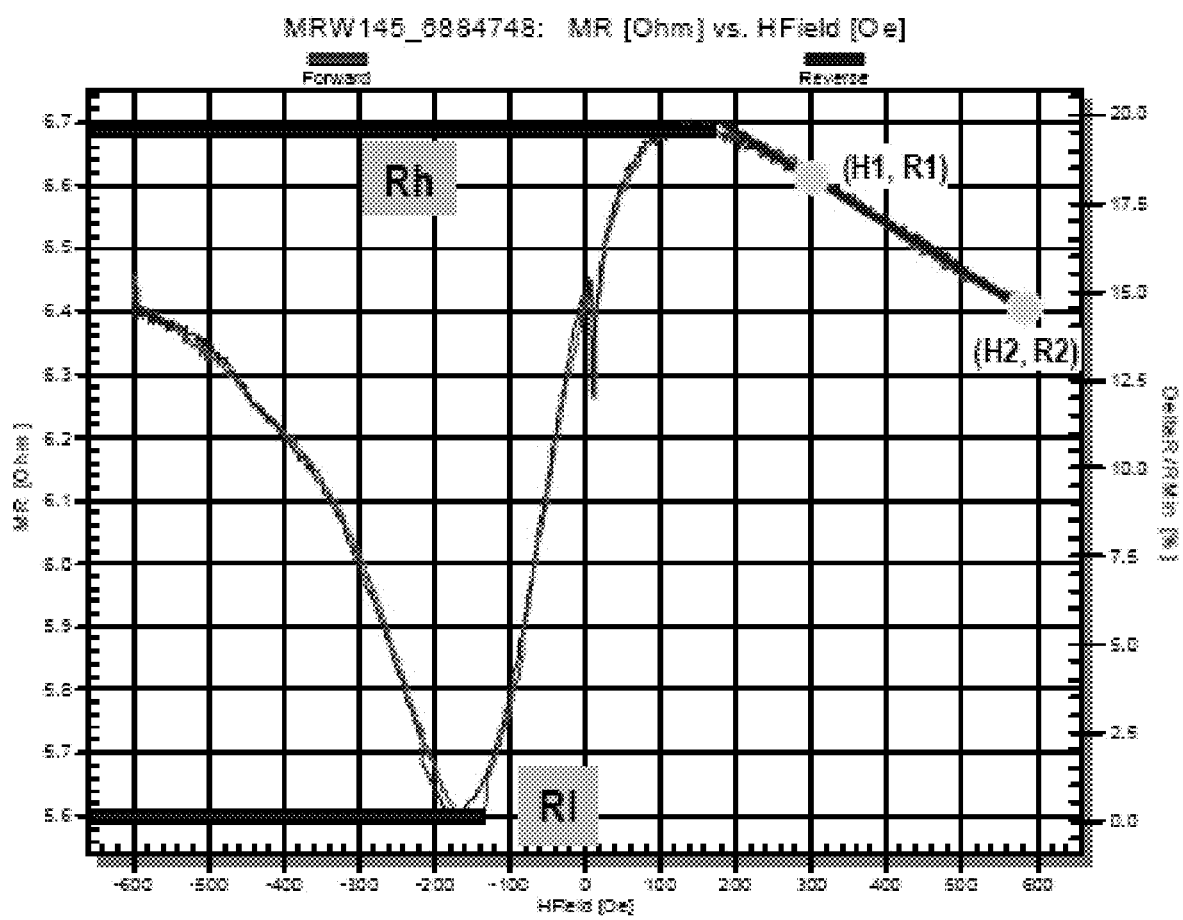
FIG. 4 is a graph illustrating a longitudinal transfer curve of the resistance of a TMR sensor stack vs. an applied magnetic field strength in accordance with one aspect of the subject disclosure.

This linear range also appears in transfer curves of resistance, as can be seen with reference to FIG. 4, which illustrates a longitudinal transfer curve of the resistance of a TMR sensor stack vs. an applied magnetic field strength in accordance with one aspect of the subject disclosure. The P2 stiffness can also be calculated using the linear range in FIG. 4 according to the equation:

$$H_{P2S} = \frac{R_l^{-1} - R_h^{-1}}{R_2^{-1} - R_1^{-1}} (H_2 - H_1) \tag{2}$$

where $R_l$ is a minimum measured resistance value, $R_h$ is a maximum measured resistance value, $R_1$ and $R_2$ are first and second resistance values measured in range of substantially linearly varying resistance, and $H_1$ and $H_2$ are first and second amplitudes of the external magnetic field corresponding to $R_1$ and $R_2$.

Figure 5A:
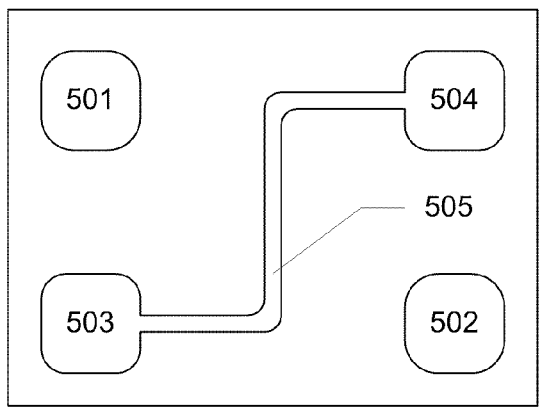
FIGS. 5a to 5c illustrate a TMR film test structure in accordance with one aspect of the subject disclosure.
Figure 5B:
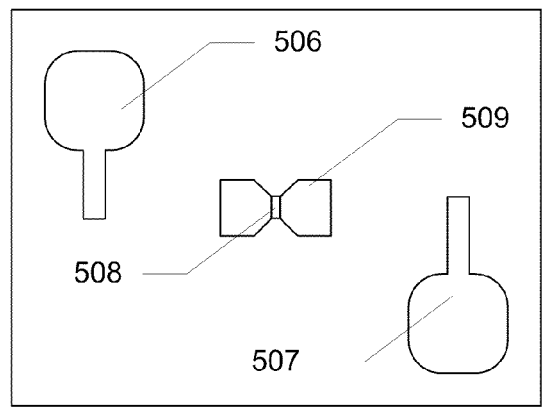
Figure 5C:
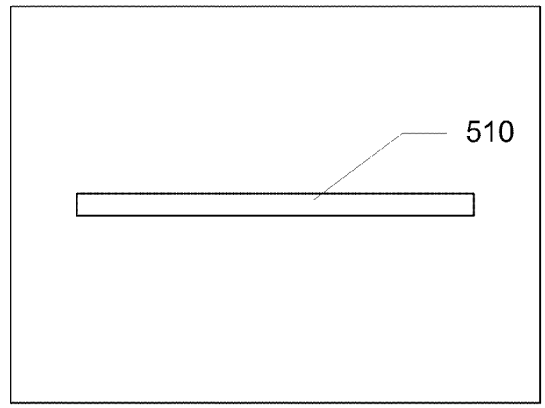

The track width and stripe height of a TMR film test structure may be selected to minimize the strength of the externally applied magnetic field necessary to detect the perturbation rotation of a P2 field in the test structure. FIGS. 5a to 5c illustrate one such test structure in accordance with one aspect of the subject disclosure. In particular, FIG. 5a shows a pattern for the MS or L3 layer, in which four contact pads are disposed. For current-perpendicular-to-plan (CPP) heads like TMR heads, two pads (501 and 502) are for bottom leads and the other two pads (503 and 504) are for top leads. In accordance with another embodiment of the subject disclosure, the test structure could also be designed to have two or three pads, but the four point design enjoys the least contact resistance. Contact pads 503 and 504 are joined by a bridge 505, which connects these pads to the upper portion of the TMR film test structure of FIG. 5b. Surrounding the contact pads and bridge is an alumina refill.

Figure 1:
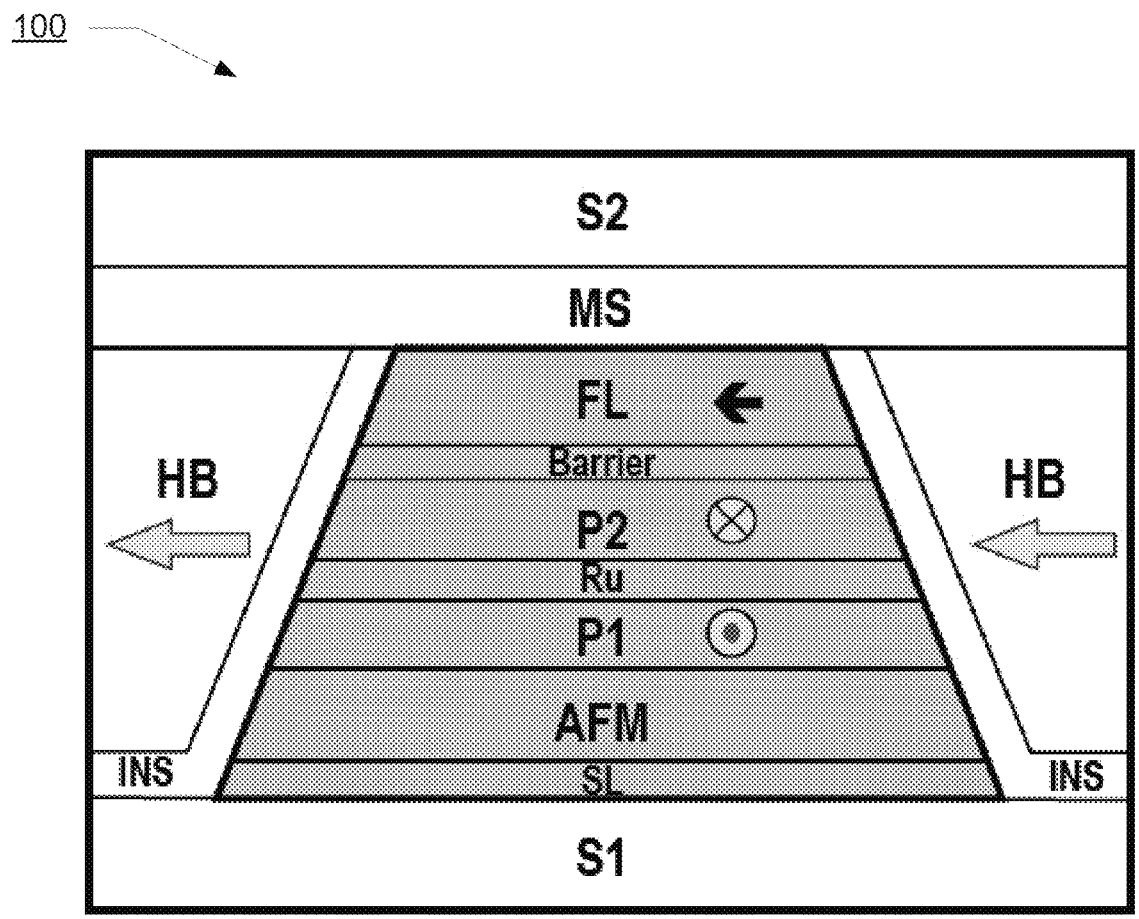
FIG. 1 illustrates a TMR head film stack in accordance with one aspect of the subject disclosure.

Turning to FIG. 5b, the pattern for the TMR layers is illustrated. For each of the free layer, the barrier layer, the P1 pinning layer, the spacer layer, the P2 pinned layer, the antiferromagnetic layer and the seed layer, the pattern includes two regions 506 and 507 to carry the applied current used to measure the resistance/conductance from contact pads 501 and 502 to the bottom of the film stack, and a test structure region 508 of predetermined track width and stripe height. Surrounding the test structure region 508 in each of these layers is a region of CoPt hard bias, as illustrated in greater detail above, in FIG. 1. As in FIG. 5a, the region surrounding contact pads 506, 507, test structure region 508 and hard bias 509 comprises an alumina refill.

FIG. 5c illustrates a pattern for the S1 shield layer, which carrier the current from contact pads 501 and 502 to the bottom layer (the seed layer) of test structure region 508.

Because the shield layer may contribute a stray field that could impact the measurement of changing resistance in the TMR stack, the aspect ratio of the shield layer is designed to minimize the impact of the stray field thus generated. The stray field can be modeled based on the shield geometry (e.g., length, width, and thickness). A high stray field from the shield layer will require a higher amplitude sweeping magnetic field to detect the linear response region in the transfer curve, so the proper design of the shield layer is important to keeping the testing method non-destructive. For example, in the exemplary shield layer illustrated in FIG. 5c, the S1 strip 510 is elongated in the HB field direction with an aspect ratio (length:width) of about than 20:1. This arrangement minimizes the impact of the stray field on the longitudinal transfer curve.

While the foregoing exemplary embodiment has been illustrated as including a pattern in the S1 shield layer, the scope of the present invention is not limited to such an arrangement. Rather, as will be readily apparent to those of skill in the art, a test structure of the present invention may be designed with a patterned S2 layer in place of the S1 layer, or may alternatively include structures in both the S1 and S2 shield layers.

The patterns of FIGS. 5a to 5c together form a three-dimensional structure in the TMR film stack, with which the four contact pads are in electrical contact. In particular, a current applied to contact pads 501 and/or 502 will be carried by regions 506 and 507 to the bottom of the test structure region 508 (via S1 strip 510), through which the current will pass up and out of bridge 505 and contact pads 503 and/or 504. A measurement of the resistance or conductance of the vertical structure formed by test structure region 508 in each of the TMR layers can therefore be accomplished with a four point test probe interacting with the four contact pads (e.g., two contact pads for injecting and extracting voltage, respectively, and two for measuring a change in resistance).

Figure 6:
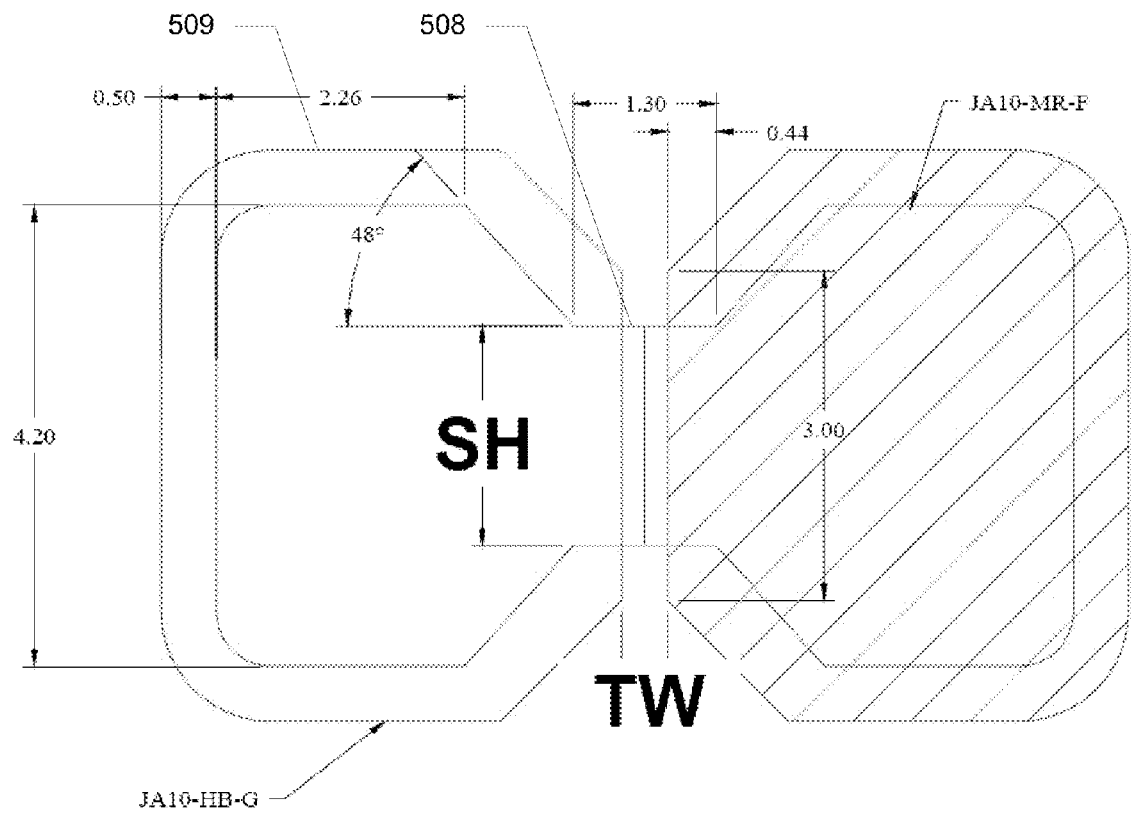
FIG. 6 illustrates a partial view of a TMR film test structure in accordance with one aspect of the subject disclosure.

Test structure region 508 is illustrated in greater detail in FIG. 6, in accordance with one aspect of the subject disclosure. The test structure region 508 is defined by track width (TW) and stripe height (SH). The TW is chosen such that the peak positions of $G_h$ and $G_l$ (or $R_l$ and $R_h$) are located within a range measurable by a QST (e.g., reducing the size of the test structure region 508 will increase the resistance thereof, and vice versa). The SH is chosen such that the free FL layer can rotate consistently in one direction and so that the hysteresis of the transfer curves is minimized, to ensure the clear definition of $G_h$ and $G_l$ values. In the present exemplary embodiment illustrated in FIG. 6, the track width TW=0.4 μm and the SH=2 μm. As will be readily apparent to those of skill in the art, these values are exemplary, and the scope of the present invention is not limited to these values.

According to one aspect of the subject disclosure, the test structure of FIGS. 5a to 5c is disposed in a test region of a wafer in which one or more TMR read heads are also disposed. This allows the P2 stiffness of the TMR test structure (and by extension, of the TMR heads on the same wafer) to be tested following the deposition of contact pads 501, 502, 503 and 504 (either in the MS or L3 layer). According to another aspect of the subject disclosure, however, the P2 stiffness of the TMR test structure may also be tested after the wafer has been sliced into one or more bars.

A quasi-static tester (QST) may be used to perform the testing on the TMR test structure, in accordance with one aspect of the subject disclosure. In this regard, the QST includes the electronics for measuring resistance/conductance by sourcing either current or voltage, an electromagnet capable of generating and varying the aforementioned external magnetic field, and a prober that can move and interact with the wafer to be tested. The QST tester is used to capture the transfer curves of resistance/conductance versus magnetic field illustrated in FIGS. 3 and 4.

While in the foregoing exemplary embodiments, the testing systems and methods have been described with respect to tunneling magnetoresistance (TMR) heads, the scope of the present invention is not limited to such an application. Rather, as will be readily apparent to those of skill in the art, the present invention has application to any magnetoresistive head design, in which the stiffness of a pinned layer is to be measured.

The description of the invention is provided to enable any person skilled in the art to practice the various embodiments described herein. While the present invention has been particularly described with reference to the various figures and embodiments, it should be understood that these are for illustration purposes only and should not be taken as limiting the scope of the invention.

There may be many other ways to implement the invention. Various functions and elements described herein may be partitioned differently from those shown without departing from the spirit and scope of the invention. Various modifications to these embodiments will be readily apparent to those skilled in the art, and generic principles defined herein may be applied to other embodiments. Thus, many changes and modifications may be made to the invention, by one having ordinary skill in the art, without departing from the spirit and scope of the invention.

A reference to an element in the singular is not intended to mean "one and only one" unless specifically stated, but rather "one or more." The term "some" refers to one or more. Underlined and/or italicized headings and subheadings are used for convenience only, do not limit the invention, and are not referred to in connection with the interpretation of the description of the invention. All structural and functional equivalents to the elements of the various embodiments of the invention described throughout this disclosure that are known or later come to be known to those of ordinary skill in the art are expressly incorporated herein by reference and intended to be encompassed by the invention. Moreover, nothing disclosed herein is intended to be dedicated to the public regardless of whether such disclosure is explicitly recited in the above description.

What is claimed is:

1. A method of testing P2 stiffness of a magnetoresistance MR sensor stack including a P2 pinned layer, comprising the steps of:
   applying an external magnetic field to the MR sensor stack, the external magnetic field oriented substantially perpendicular to a magnetic field of the P2 pinned layer;
   varying an amplitude of the external magnetic field;
   measuring a change in a resistance of the MR sensor stack in response to the varying amplitude of the external magnetic field; and
   calculating the P2 stiffness based on the measured change in resistance.

2. The method according to claim 1, wherein the MR sensor stack comprises:
   a free layer,
   a barrier layer,
   a synthetic antiferromagnetic layer including a P1 pinning layer, the P2 pinned layer and a spacer layer separating the P1 pinning layer and the P2 pinned layer,
   an antiferromagnetic layer, and
   a seed layer.

3. The method according to claim 2, wherein measuring the change in the resistance comprises measuring a change in resistance of a circuit path passing through the free layer, the barrier layer, the synthetic antiferromagnetic layer, the antiferromagnetic layer and the seed layer.

4. The method according to claim 1, wherein the external magnetic field is oriented substantially parallel to a magnetic field of a hard bias layer disposed adjacent to the MR sensor stack.

5. The method according to claim 1, wherein the amplitude of the external magnetic field is varied between about −50% and 50% of a coercivity of a hard bias layer adjacent to the MR sensor stack.

6. The method according to claim 1, wherein the amplitude of the external magnetic field is varied between about −1000 oersted and 1000 oersted.

7. The method according to claim 1, wherein measuring the change in the resistance of the MR sensor stack comprises measuring a change in the conductance of the MR sensor stack.

8. The method according to claim 1, wherein calculating the P2 stiffness comprises solving for $H_{P2S}$, where:

$$H_{P2S} = \frac{R_l^{-1} - R_h^{-1}}{R_2^{-1} - R_1^{-1}}(H_2 - H_1),$$

where $R_l$ is a minimum measured resistance value, $R_h$ is a maximum measured resistance value, $R_1$ and $R_2$ are first and second resistance values measured in range of substantially linearly varying resistance, and $H_1$ and $H_2$ are first and second amplitudes of the external magnetic field corresponding to $R_1$ and $R_2$.

9. The method according to claim 8, wherein the MR sensor stack has a track width and a stripe height configured such that $R_l$ and $R_h$ are within a predetermined measurable range.

10. The method according to claim 1, wherein the MR sensor stack is a test structure with a track width of about 0.4 μm and a stripe height of about 2 μm.

11. The method according to claim 10, wherein the test structure includes two or more contact points for measuring the change in the resistance of the MR sensor stack.

12. The method according to claim 10, wherein the test structure is disposed in a test region of a wafer in which are also disposed one or more MR heads.

13. The method according to claim 1, wherein the P2 stiffness of the MR sensor stack is tested following the deposition of contact points on a wafer including the MR sensor stack.

14. The method according to claim 1, wherein the P2 stiffness of the MR sensor stack is tested after a wafer including the MR sensor stack has been sliced into one or more bars.

15. The method according to claim 1, wherein the MR sensor stack is a tunneling magnetoresistance (TMR) sensor stack.

* * * * *